(12) United States Patent
Kim

(10) Patent No.: US 9,952,290 B2
(45) Date of Patent: Apr. 24, 2018

(54) APPARATUS AND METHOD FOR DETECTING POWER ABNORMALITY OF ENGINE-TYPE FORKLIFT TRUCK

(71) Applicant: DOOSAN CORPORATION, Seoul (KR)

(72) Inventor: Pyung Soo Kim, Gyeonggi-do (KR)

(73) Assignee: DOOSAN CORPORATION, Seoul (KR)

( * ) Notice: Subject to any disclaimer, the term of this patent is extended or adjusted under 35 U.S.C. 154(b) by 0 days.

(21) Appl. No.: 15/101,451

(22) PCT Filed: Sep. 30, 2014

(86) PCT No.: PCT/KR2014/009179
§ 371 (c)(1),
(2) Date: Jun. 3, 2016

(87) PCT Pub. No.: WO2015/099268
PCT Pub. Date: Jul. 2, 2015

(65) Prior Publication Data
US 2016/0370436 A1 Dec. 22, 2016

(30) Foreign Application Priority Data
Dec. 24, 2013 (KR) .......................... 10-2013-0162295

(51) Int. Cl.
*G01R 1/00* (2006.01)
*G01R 31/36* (2006.01)
(Continued)

(52) U.S. Cl.
CPC ............ *G01R 31/3689* (2013.01); *B60L 1/00* (2013.01); *B60L 3/0046* (2013.01);
(Continued)

(58) Field of Classification Search
CPC .......... G01R 31/3689; B66F 9/22; B66F 9/24; G08B 21/182
(Continued)

(56) References Cited

U.S. PATENT DOCUMENTS

2010/0090653 A1   4/2010  Kuwano
2010/0164439 A1*  7/2010  Ido ........................ B60L 11/182
                                                              320/155
(Continued)

FOREIGN PATENT DOCUMENTS

CN         201268232 Y     7/2009
CN         202297042 U     7/2012
(Continued)

OTHER PUBLICATIONS

Office Action issued in corresponding Chinese Patent Application No. 201480070389.5 dated Mar. 24, 2017.
(Continued)

*Primary Examiner* — Daryl Pope
(74) *Attorney, Agent, or Firm* — Volpe and Koenig, P.C.

(57) ABSTRACT

The present disclosures relates to an apparatus and a method for detecting power abnormality of an engine-type forklift truck, and the apparatus for detecting power abnormality of an engine-type forklift truck includes: a power supply unit including a pair of batteries so as to supply power to an electric device included in an engine-type forklift truck; an engine control unit (ECU) which receives power from the power supply unit; an equalizer which is provided between the power supply unit and the ECU so as to maintain a voltage balance between the pair of batteries and adjust a voltage of power supplied to the ECU; and an abnormality detecting unit which compares a voltage input from the pair of batteries with a voltage input from any one of the pair of batteries, and detects abnormality in the voltage balance.

9 Claims, 5 Drawing Sheets

(51) Int. Cl.
| | |
|---|---|
| *B66F 9/24* | (2006.01) |
| *F02D 29/02* | (2006.01) |
| *B66F 9/06* | (2006.01) |
| *B66F 9/22* | (2006.01) |
| *G08B 21/18* | (2006.01) |
| *B60L 1/00* | (2006.01) |
| *B60L 3/00* | (2006.01) |
| *B60L 11/18* | (2006.01) |
| *H02J 7/00* | (2006.01) |

(52) U.S. Cl.
CPC ............ *B60L 11/1866* (2013.01); *B66F 9/06* (2013.01); *B66F 9/22* (2013.01); *B66F 9/24* (2013.01); *F02D 29/02* (2013.01); *G08B 21/182* (2013.01); *H02J 7/0014* (2013.01); *Y02T 10/7005* (2013.01); *Y02T 10/7061* (2013.01)

(58) Field of Classification Search
USPC ................ 340/455, 3.1, 506, 425.5, 438
See application file for complete search history.

(56) References Cited

U.S. PATENT DOCUMENTS

| | | |
|---|---|---|
| 2011/0254502 A1 | 10/2011 | Yount |
| 2011/0313608 A1* | 12/2011 | Izumi ........................ B60L 1/20 701/22 |
| 2012/0194134 A1 | 8/2012 | Kain |
| 2012/0239243 A1 | 9/2012 | Medwin |

FOREIGN PATENT DOCUMENTS

| | | |
|---|---|---|
| CN | 103311595 A | 9/2013 |
| EP | 1557393 A2 | 7/2005 |
| JP | H11201007 A | 7/1999 |
| JP | 2008303058 A | 12/2008 |
| JP | 2009298543 A | 12/2009 |
| JP | 2010037011 | 2/2010 |
| KR | 10-1990-0009335 A | 7/1990 |

OTHER PUBLICATIONS

Office Action dated Sep. 7, 2017 in counterpart Chinese Patent Appln. No. 201480070389.5, consisting of 15 pp. (English Translation Provided).

Extended European Search Report dated Sep. 19, 2017 in counterpart European Patent Appln. No. 14875740.4, consisting of 7 pp.

Peng Lei., The Electronics Newspaper dated Nov. 30, 2013, pp. 710-711.

International Search Report mailed in corresponding International Patent Application No. PCT/KR2014/009179 dated Jan. 14, 2015, consisting of 5 pp. (English Translation Provided).

Written Opinion mailed in corresponding International Patent Application No. PCT/KR2014/009179 dated Jan. 14, 2015, consisting of 4 pp.

\* cited by examiner

APPARATUS AND METHOD FOR DETECTING POWER ABNORMALITY OF ENGINE-TYPE FORKLIFT TRUCK

TECHNICAL FIELD

The present disclosure relates to an apparatus and a method for detecting power abnormality of an engine-type forklift truck, which detect the generation of power abnormality.

BACKGROUND ART

In general, a forklift truck is used for lifting up and unloading cargo, or transporting the cargo to a necessary location in a work place. The forklift truck is divided into an engine-type forklift truck and an electric-motor-type forklift truck according to a power source, and the engine-type forklift truck (hereinafter, abbreviated as the "forklift truck") among them drives a hydraulic pump with an engine, drives a vehicle with pressured oil discharged from the hydraulic pump, and drives an operating device.

As illustrated in FIG. 1, a forklift truck 1 includes a mast 9 mounted to a vehicle frame 8 to be pivotable, a carrier 10 supported to the mast 9 in order to transport a cargo, a tilt cylinder 12 operating the mast 9 to be inclined based on a pivot point of the mast 9, a lift cylinder 11 operating the carrier 10 to be elevated, and the like.

The mast 9 is formed of an external mast 9a formed at an external side thereof and an internal mast 9b formed at an internal side thereof, and the internal mast 9b supports the carrier 10, and ascends/descends by the lift cylinder 11.

The tilt cylinder 12 and the lift cylinder 11 are operated by a tilt lever 13 and a lift lever 14, and the tilt lever 13 and the lift lever 14 are installed within a driver's cabin, so that a user may operate the tilt lever 13 and the lift lever 14 inside the driver's cabin.

In the meantime, in order to park the forklift truck 1, a parking brake 3 and a parking brake switch 21 for switching the parking brake 3 are formed on a front side of a driver's seat 2.

In general, a medium and large engine-type forklift truck identically uses battery power of about 24 direct current voltage (DCV), which is electric voltage specifications of all of the electric devices including a system power supply and an engine control unit (ECU).

However, the ECU in the present invention is operated at about 12 DCV, so that it is necessary to stably and continuously supply power of 12 DCV to the ECU.

DISCLOSURE

Technical Problem

The present invention is conceived to solve the aforementioned problem, and to provide an apparatus and a method for detecting power abnormality of an engine-type forklift truck, which are capable of stably supplying power to an engine control unit, and quickly detecting abnormality even when the abnormality is generated in an equalizer.

A technical object to be achieved in the present disclosure is not limited to the aforementioned technical objects, and other not-mentioned technical objects will be obviously understood from the description below by those skilled in the technical field to which the present disclosure pertains.

Technical Solution

In order to achieve the object, an apparatus for detecting power abnormality of an engine-type forklift truck of the present disclosure includes: a power supply unit including a pair of batteries so as to supply power to an electric device included in an engine-type forklift truck; an engine control unit (ECU) which receives power from the power supply unit; an equalizer which is provided between the power supply unit and the ECU so as to maintain a voltage balance between the pair of batteries and adjust a voltage of power supplied to the ECU; and an abnormality detecting unit which detects whether abnormality is generated in the equalizer by comparing voltage input from the pair of batteries with a voltage input from any one of the pair of batteries, and detecting whether the pair of batteries has the voltage balance.

The abnormality detecting unit may detect a voltage of each of the pair of batteries, and when a difference between the detected voltages is equal to or larger than a predetermined voltage value, the abnormality detecting unit may determine that the abnormality is generated in the equalizer.

The abnormality detecting unit may detect whether the pair of batteries has the voltage balance when a predetermined standby time elapses after an engine starts.

The apparatus may further include a warning unit which includes a warning buzzer generating a warning sound and a warning lamp generating warning light when the abnormality detecting unit detects an abnormal voltage of the pair of batteries.

The warning unit may generate the warning sound or the warning light at a predetermined warning time interval.

In the meantime, in order to achieve the object, a method for detecting power abnormality of an engine-type forklift truck of the present disclosure includes: a starting operation of driving an engine of an engine-type forklift truck; a voltage detecting operation of detecting a voltage of each of a pair of batteries supplying power to an electric device included in the engine-type forklift truck; a voltage balance determining operation of comparing a difference between the detected voltages of the pair of batteries with a predetermined voltage value; and a warning operation of generating, by a warning unit, at least one of a warning sound and warning light when the difference in the voltage between the pair of batteries is equal to or larger than the predetermined voltage value in the voltage balance determining operation.

The voltage balance determining operation may include calculating a difference value (V1) between the voltages input from the pair of batteries and a voltage input from any one of the pair of batteries, calculating an absolute value (V2) of a difference value between the difference value (V1) and the voltage input from any one of the pair of batteries, and comparing the absolute value (V2) with the predetermined voltage value.

The warning operation may include generating, by the warning unit, at least one of the warning sound and the warning light at a predetermined warning time interval.

The method may further include: a warning determining operation of determining whether the warning unit generates the warning sound or the warning light when the difference in the voltage between the pair of batteries is less than the predetermined voltage value in the voltage balance determining operation; a voltage balance re-determining operation of comparing the difference in the voltage between the pair of batteries with the predetermined voltage value when the warning unit generates the warning sound or the warning light in the warning determining operation; and a warning off operation of turning off, by the warning unit, the warning sound and the warning light when the difference in the voltage between the pair of batteries is less than the predetermined voltage value in the voltage balance re-determining operation.

The method may further include a standby operation of standing by for a predetermined standby time after driving the engine in the starting operation.

Advantageous Effects

According to the present disclosure, an equalizer is provided, so that it is possible to stably and continuously supply power of about 12 DCV to an engine control unit in a forklift truck using battery power of about 24 DCV, and maintain a voltage balance of a power supply unit including a plurality of batteries.

Further, even when abnormality is generated in the equalizer during an operation of a vehicle, it is possible to rapidly detect the generation of the abnormality, thereby preventing the generation of a safety accident of a forklift truck due to a shortage in power of a power supply unit.

BEST MODE

Figure 1:
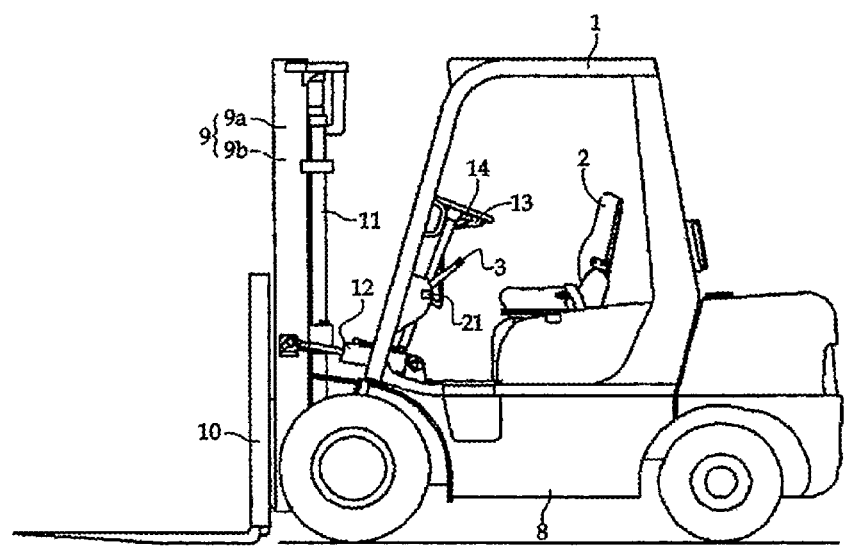
FIG. 1 is a side view illustrating a general engine-type forklift truck.

Hereinafter, an exemplary embodiment according to the present disclosure will be described in detail with reference to the accompanying drawings. In the process, a size or a shape of a constituent element illustrated in the drawing, and the like, may be exaggerated for clarity and ease of description. In addition, the terms, which are specially defined in consideration of configurations and operations of the present disclosure, may vary depending on the intention or usual practice of a user or an operator. These terms should be defined based on the content throughout the present specification. Further, the spirit of the present disclosure is not limited to the suggested exemplary embodiment, those skilled in the art who understand the spirit of the present disclosure may easily carry out other exemplary embodiments within the scope of the same spirit, and of course, the exemplary embodiments also belong to the scope of the present disclosure.

Figure 2:
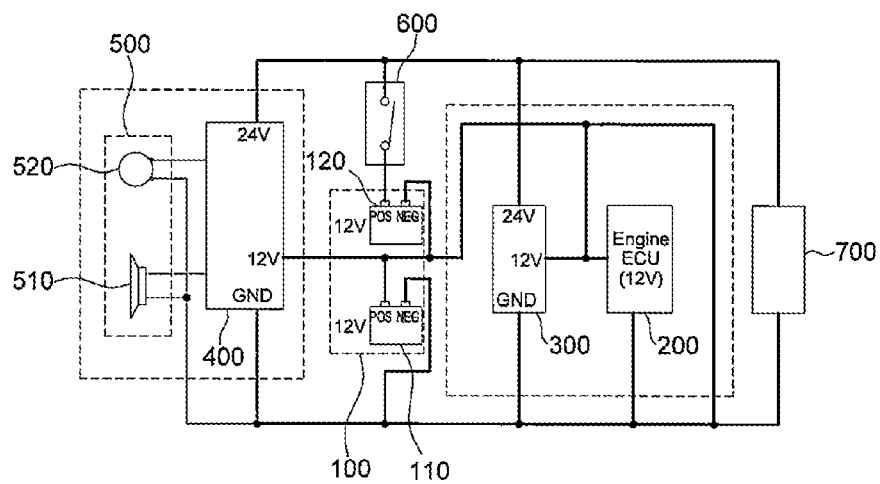
FIG. 2 is a circuit diagram illustrating an apparatus for detecting power abnormality of an engine-type forklift truck according to an exemplary embodiment of the present disclosure.
Figure 3:
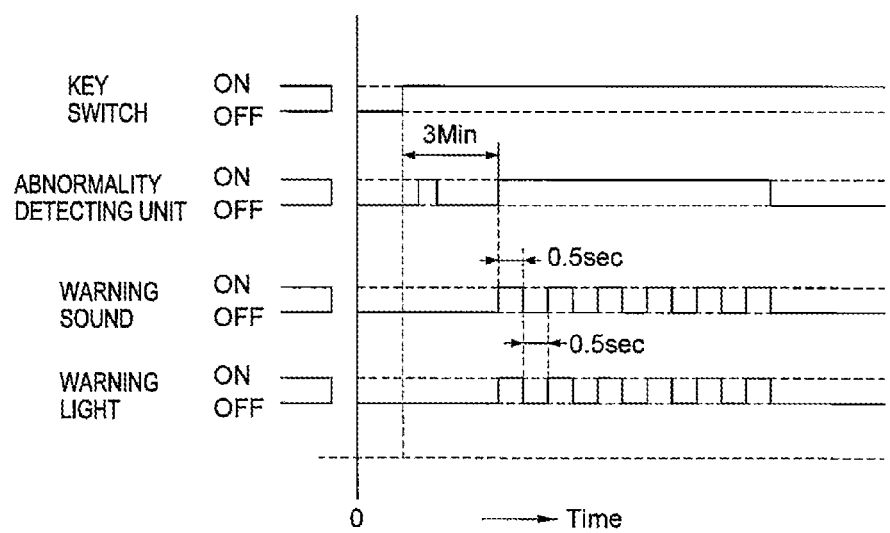
FIG. 3 is a graph illustrating an operation time of the apparatus for detecting power abnormality of the engine-type forklift truck according to the exemplary embodiment of the present disclosure.

FIG. 2 is a circuit diagram illustrating an apparatus for detecting power abnormality of an engine-type forklift truck according to an exemplary embodiment of the present disclosure, and FIG. 3 is a graph illustrating an operation time of the apparatus for detecting power abnormality of the engine-type forklift truck according to the exemplary embodiment of the present disclosure.

A configuration and a function of the apparatus for detecting power abnormality of the engine-type forklift truck will be described in detail with reference to FIGS. 2 and 3.

The apparatus for detecting power abnormality of the engine-type forklift truck is for preventing a safety accident of the forklift truck due to a shortage of power of a power supply unit by stably supplying power to an engine control unit (ECU) and rapidly detecting abnormality even when the abnormality is generated in an equalizer, which is a power converting device, and may include a power supply unit 100, an engine control unit (ECU) 200, an equalizer 300, an abnormality detecting unit 400, and a warning unit 500.

The power supply unit 100, which supplies power to various electric devices 700 included in the forklift truck, may be configured so that a pair of batteries 110 and 120, that is, a first battery 110 and a second battery 120, is serially connected with each other.

According to the exemplary embodiment of the present disclosure, each of the first battery 110 and the second battery 120 may provide about 12 direct current voltage (DCV), and thus, about 24 DCV may be provided to the electric device 700 and the like.

The ECU 200, which controls an engine of the forklift truck, receives power from the power supply unit 100. According to the exemplary embodiment of the present disclosure, the ECU 200 is operated with about 12 DCV, so that it is necessary to adjust a voltage provided from the power supply unit 100, and the adjustment of the voltage may be performed by the equalizer 300.

That is, the equalizer 300 may be provided between the power supply unit 100 and the ECU 200 to adjust a voltage of power supplied to the ECU 200.

According to the exemplary embodiment of the present disclosure, each of the first battery 110 and the second battery 120 configuring the power supply unit 100 is a power source providing about 12 DCV, and the first battery 110 and the second battery 120 are serially connected to each other to provide about 24 DCV, so that the equalizer 300 adjusts the power of about 24 DCV applied from the power supply unit 100 to power of about 12 DCV and supplies the adjusted power of about 12 DCV to the ECU 200.

Further, the equalizer 300 may serve to maintain a voltage balance between the first battery 110 and the second battery 120 configuring the power supply unit 100.

Here, the voltages supplied by the first battery 110 and the second battery 120 as power and the voltage for operating the ECU 200 are illustrative, so that the voltages may have difference values according to the kind of forklift truck and a capacity of the power supply unit 100, and the contents of the present disclosure are not limited by the respective voltage values.

The abnormality detecting unit 400 determines whether the equalizer 300 has abnormality by comparing voltages input from the pair of batteries 110 and 120 with a voltage input from any one of the pair of batteries 110 and 120 and detecting whether the pair of batteries 110 and 120 have the voltage balance.

That is, when a problem, such as damage of the equalizer 300, is generated during an operation of the engine-type forklift truck, any one of the pair of batteries 110 and 120, for example, only the first battery 110, supplies power to the ECU 200 as illustrated in FIG. 2, so that an overdischarging phenomenon is generated in the first battery 110.

Accordingly, the forklift truck cannot be normally operated due to the shortage in driving power to cause a safety accident and the like, and further, the continuous overdischarging phenomenon of the power supply unit 100 shortens a life of an expensive battery and makes the battery be frequently replaced, thereby requiring the large amount of costs.

Accordingly, according to the exemplary embodiment of the present disclosure, the abnormality detecting unit 400 detects a voltage of each of the pair of batteries 110 and 120, and when a difference between the detected voltages is equal to or larger than a predetermined voltage value, the abnormality detecting unit 400 determines that the equalizer 300 fails to maintain a voltage balance between the first battery 110 and the second battery 120, so that abnormality is generated in the equalizer 300.

Accordingly, a driver of the forklift truck may recognize the generation of abnormality in the equalizer 300 and the generation of overdischarging in the power supply unit 100 in advance, thereby preventing a safety accident and preventing a life of the battery from being shortened.

Accordingly, according to the exemplary embodiment of the present disclosure, the first battery 110 and the second battery 120 provide power of about 12 DCV, so that it is preferable that the predetermined voltage value, which is the difference between the detected voltage values, is about 1 V, which is illustrative, and the predetermined voltage value may be changed according to the kind of forklift truck and a capacity of the power supply unit 100, and the contents of the present disclosure are not limited by the predetermined voltage value.

When a predetermined standby time elapses after the start of the engine, the abnormality detecting unit 400 may detect whether the first battery 110 and the second battery 120 have the voltage balance. That is, when starting the forklift truck, a key switch 600 is turned on in order to supply power of the power supply unit 100 to the equalizer 300, the abnormality detecting unit 400, and the electric device 700, and in this case, a voltage state of the power supply unit 100 is unstable, so that the abnormality detecting unit 400 may be operated after the predetermined standby time so as to accurately detect a difference in the voltage between the first battery 110 and the second battery 120.

Accordingly, according to the exemplary embodiment of the present disclosure, as illustrated in FIG. 3, it is preferable to set the predetermined standby time to about three minutes, which is illustrative, and the predetermined standby time may be differently set according to the kind of forklift truck and a capacity of the power supply unit 100, and the contents of the present disclosure are not limited by the predetermined standby time.

When the abnormality detecting unit 400 detects the abnormality of the equalizer 300, the warning unit 500 warns the driver of an abnormality generation situation, and may be provided with at least one of a warning buzzer 510 generating a warning sound and a warning lamp 520 generating warning light.

That is, when the abnormality is generated in the equalizer 300, so that the first battery 110 and the second battery 120 cannot maintain the voltage balance, the warning unit 500 immediately generates a warning sound or warning light to the driver to enable the driver to recognize the overdischarge of the power supply unit 100 in advance.

Further, the warning unit 500 generates a warning sound or warning light at a predetermined warning time interval, and according to the exemplary embodiment of the present disclosure, it is preferable to set the predetermined warning time to about 0.5 second as illustrated in FIG. 3, which is illustrative, and the predetermined warning time may be differently set according to a working environment and the like, and the contents of the present disclosure are not limited by the predetermined warning time.

Figure 4:
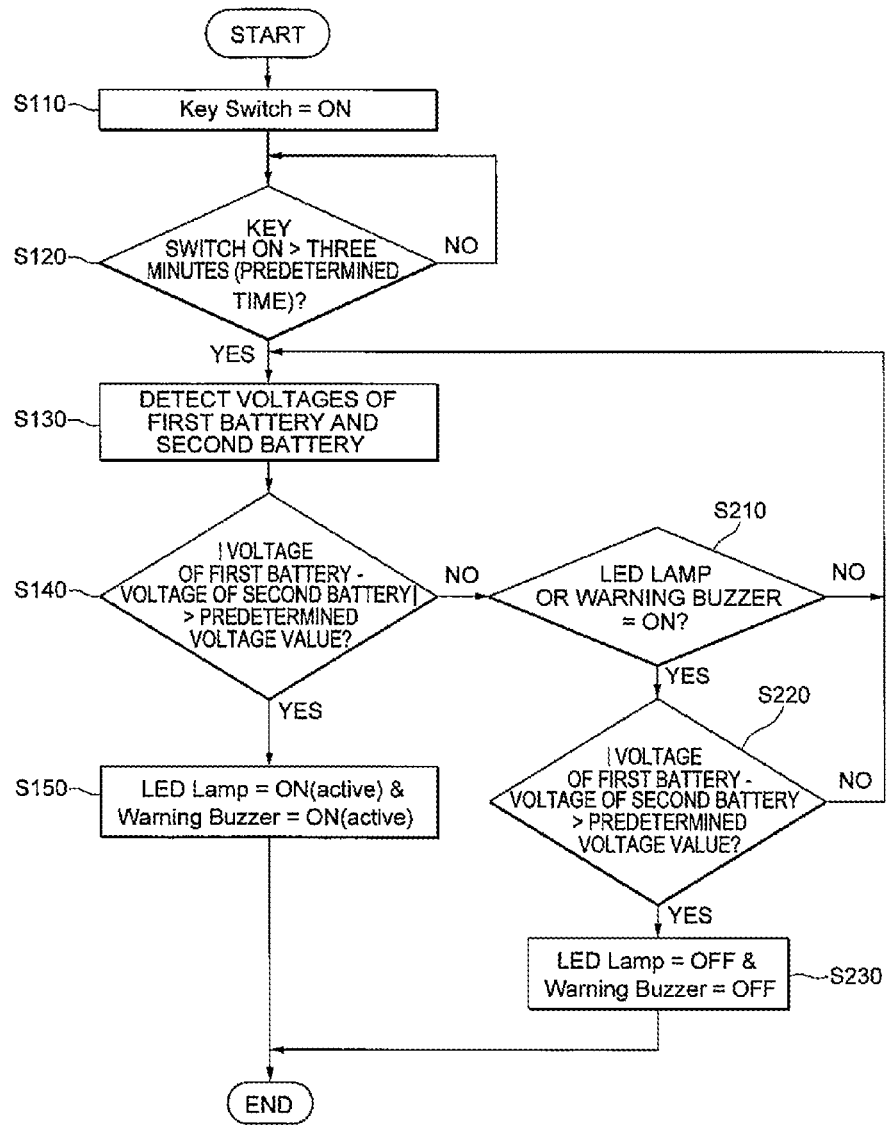
FIG. 4 is a flowchart of a method for detecting power abnormality of an engine-type forklift truck according to an exemplary embodiment of the present disclosure.
Figure 5:
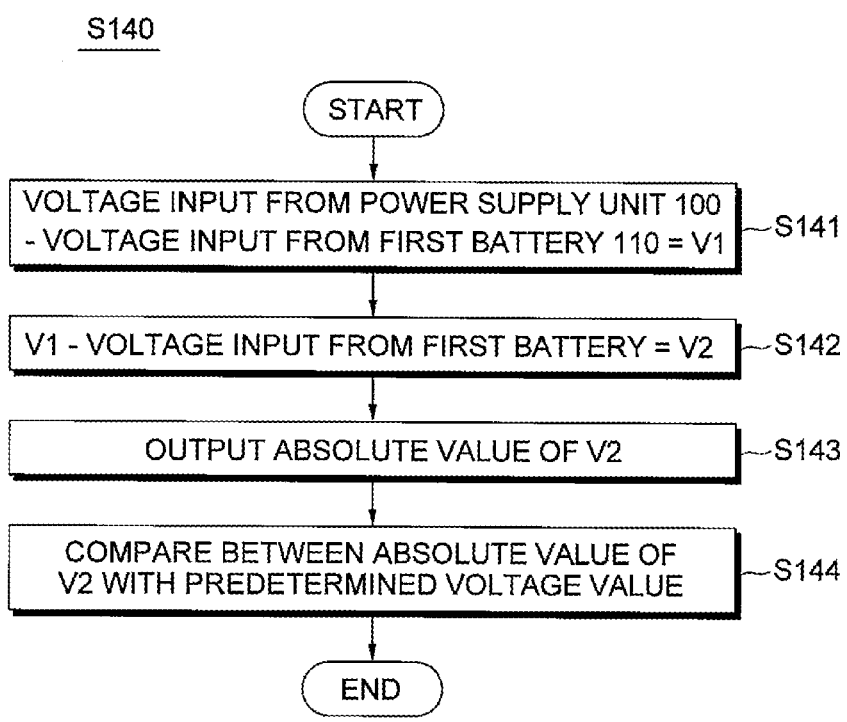
FIG. 5 is a diagram illustrating a method of determining a voltage balance of the method for detecting power abnormality of the engine-type forklift truck according to the exemplary embodiment of the present disclosure.

FIG. 4 is a flowchart illustrating a method for detecting power abnormality of an engine-type forklift truck according to an exemplary embodiment of the present disclosure, and FIG. 5 is a flowchart illustrating a method of determining a voltage balance of the method for detecting power abnormality of the engine-type forklift truck according to the exemplary embodiment of the present disclosure.

The method for detecting power abnormality of the engine-type forklift truck will be described in detail with reference to FIGS. 4 and 5.

Referring to FIGS. 4 and 5, the method for detecting power abnormality of the engine-type forklift truck may include a starting operation S110, a standby operation S120, a voltage detecting operation S130, a voltage balance determining operation S140, a warning operation S150, a warning determining operation S210, a voltage balance re-determining operation S220, and a warning off operation S230.

The starting operation S110 is an operation for driving the engine of the forklift truck, in which the key switch 600 is turned on in order to supply power of the power supply unit 100 to the equalizer 300, the abnormality detecting unit 400, and the electric device 700 when starting the forklift truck.

The standby operation S120 is an operation, in which the engine stands by for a predetermined standby time after driving the engine in the starting operation S110, and a voltage state of the power supply unit 100 is unstable at an early time of the starting of the engine, so that the engine stands by for the predetermined standby time so as to accurately detect a difference in a voltage between the first battery 110 and the second battery 120 configuring the power supply unit 100.

Further, as described above, according to the exemplary embodiment of the present disclosure, it is preferable to set the predetermined standby time to about three minutes in the standby operation S120, which is illustrative, and the predetermined standby time may be differently set according to the kind of forklift truck and a capacity of the power supply unit 100, and the contents of the present disclosure are not limited by the predetermined standby time.

In the voltage detecting operation S130, a voltage of each of the pair of batteries 110 and 120 supplying power to the electric device 700 and the like included in the engine-type forklift truck is detected after the standby operation S120.

According to the exemplary embodiment of the present disclosure, in the voltage detecting operation S130, the abnormality detecting unit 400 detects the voltages of all of the first battery 110 and the second battery 120 which are serially connected to each other, and the voltage of the first battery 110.

In the voltage balance determining operation S140, it is determined whether the first battery 110 and the second battery 120 maintain a voltage balance by comparing the detected difference in the voltage between the pair of batteries 110 and 120 with a predetermined voltage value.

That is, in the voltage balance determining operation S140, when the detected difference in the voltage between the pair of batteries 110 and 120 is equal to or larger than the predetermined voltage value, the first battery 110 and the second battery 120 cannot maintain a voltage balance, so that it is determined that abnormality is generated in the equalizer 300.

As described above, according to the exemplary embodiment of the present disclosure, the first battery 110 and the second battery 120 provide power of about 12 DCV, so that it is preferable that the predetermined voltage value is about 1 V, which is illustrative, and the predetermined voltage value may be changed according to the kind of forklift truck and a capacity of the power supply unit 100, and the contents of the present disclosure are not limited by the predetermined voltage value.

In the meantime, referring to FIG. 5, in the voltage balance determining operation S140, a difference value V1 between the voltages input from the pair of batteries 110 and 120 and a voltage input from any one of the pair of batteries 110 and 120 is calculated (S141), an absolute value V2 of a difference value between the difference value V1 and the voltage input from any one of the pair of batteries 110 and 120 is calculated (S142 and S143), and the absolute value V2 is compared with the predetermined voltage value (S144).

For example, the first battery 110 and the second battery 120 supply power of about 12 DCV in order to operate the electric device 700 and the like of the forklift truck, and when abnormality is generated in the equalizer 300, the ECU 200 is operated only with the first battery 110, so that the first battery 110 may be overdischarged.

For example, when the second battery 120 continuously supplies power of 12 DCV, but the first battery 110 is overdischarged and supplies power of 10 DCV, the abnormality detecting unit 400 detects the voltage of 22 DCV input from the first battery 110 and the second battery 120, and detects the voltage of 10 DCV input from only the first battery 110 to calculate the difference value V1 between the voltages as 12 DCV (S141).

Further, the abnormality detecting unit 400 calculates the absolute value V2 of a difference value between the difference value V1 that is 12 DCV and 10 DCV that is the voltage input from the first battery 110 as 2 DCV (S142 and S143), and compares the absolute value V2 with 1 DCV that is the predetermined voltage value (S144).

The absolute value V2, 2 DCV, is equal to or larger than the predetermined voltage value, 1 DCV, so that the abnormality detecting unit 400 determines that the first battery 110 and the second battery 120 fail to maintain the voltage balance, so that abnormality is generated in the equalizer 300.

In the warning operation S150, when the difference in the voltage between the pair of batteries 110 and 120 is equal to or larger than the predetermined voltage value in the voltage balance determining operation S140, that is, it is determined that the abnormality is generated in the equalizer 300, the warning unit 500 generates at least one of a warning sound and warning light and notifies a driver of the generation of the abnormality.

In the warning operation S150, the warning unit 500 generates at least one of a warning sound and warning light at a predetermined warning time interval, and as described above, according to the exemplary embodiment of the present disclosure, it is preferable to set the predetermined warning time to about 0.5 second, which is illustrative, and the predetermined warning time may be differently set according to a working environment and the like, and the contents of the present disclosure are not limited by the predetermined warning time.

In the meantime, in the warning determining operation S210, when the difference in the voltage between the pair of batteries 110 and 120 is less than the predetermined voltage value in the voltage balance determining operation S140, that is, the first battery 110 and the second battery 120 maintain the voltage balance, so that it is determined that the equalizer 300 is normal, it is determined whether the warning sound or the warning light is generated in the warning unit 500.

In this case, when the warning sound or the warning light is not generated in the warning unit 500, the method returns to the voltage detecting operation S130, and when the warning sound or the warning light is not generated in the warning unit 500 in the warning determining operation S210, the difference in the voltage between the pair of batteries 110 and 120 is compared with the predetermined voltage value again in the voltage balance re-determining operation S220.

According to the exemplary embodiment of the present disclosure, the warning unit 500 formed of the warning buzzer 510 and the warning lamp 520 is also used for another use, so that even when it is determined that the difference in the voltage between the pair of batteries 110 and 120 is less than the predetermined voltage value in the voltage balance determining operation S140, and when the warning sound or the warning light is generated by the warning unit 500, the voltage balance of the power supply unit 100 is determined again in the voltage balance re-determining operation S220 in order to confirm whether the warning unit 500 is operated by the difference in the voltage between the first battery 110 and the second battery 120.

When the difference in the voltage between the pair of batteries 110 and 120 is less than the predetermined voltage value in the voltage balance re-determining operation S220, it is not that the warning unit 500 is operated by the difference in the voltage between the first battery 110 and the second battery 120, so that the warning sound and the warning light of the warning unit 500 are turned off in the warning off operation S230.

In the meantime, when the difference in the voltage between the pair of batteries 110 and 120 is equal to or larger than the predetermined voltage value in the voltage balance re-determining operation S220, the method returns to the voltage detecting operation S130.

The present invention has been described with reference to the exemplary embodiments, but the exemplary embodiments are only illustrative, and it would be appreciated by those skilled in the art that various modifications and equivalent exemplary embodiments may be made. Accordingly, the actual technical scope of the present invention must be determined by the appended claims.

The invention claimed is:

1. An apparatus for detecting power abnormality of an engine-type forklift truck, the apparatus comprising:
   a power supply unit including a pair of batteries so as to supply power to an electric device included in an engine-type forklift truck;
   an engine control unit (ECU) which receives power from the power supply unit;
   an equalizer which is provided between the power supply unit and the ECU so as to maintain a voltage balance between the pair of batteries and adjust a voltage of power supplied to the ECU; and
   an abnormality detecting unit which determines whether abnormality is generated in the equalizer by comparing voltage input from the pair of batteries with a voltage input from any one of the pair of batteries, and detecting whether the pair of batteries has the voltage balance,
   wherein the abnormality detecting unit detects a voltage of each of the pair of batteries, and when a difference between the detected voltages is equal to or larger than a predetermined voltage value, the abnormality detecting unit determines that the abnormality is generated in the equalizer.

2. The apparatus of claim 1, wherein the abnormality detecting unit detects whether the pair of batteries has the voltage balance when a predetermined standby time elapses after an engine starts.

3. The apparatus of claim 1, further comprising:
a warning unit which includes a warning buzzer generating a warning sound and a warning lamp generating warning light when the abnormality detecting unit detects an abnormal voltage of the pair of batteries.

4. The apparatus of claim 3, wherein the warning unit generates the warning sound or the warning light at a predetermined warning time interval.

5. A method for detecting power abnormality of an engine-type forklift truck, the method comprising:
a starting operation of driving an engine of an engine-type forklift truck;
a voltage detecting operation of detecting a voltage of each of a pair of batteries supplying power to an electric device included in the engine-type forklift truck;
a voltage balance determining operation of comparing a difference between the detected voltages of the pair of batteries with a predetermined voltage value; and
a warning operation of generating, by a warning unit, at least one of a warning sound and warning light when the difference in the voltage between the pair of batteries is equal to or larger than the predetermined voltage value in the voltage balance determining operation.

6. The method of claim 5, wherein the voltage balance determining operation includes calculating a difference value (V1) between the voltages input from the pair of batteries and a voltage input from any one of the pair of batteries, calculating an absolute value (V2) of a difference value between the difference value (V1) and the voltage input from any one of the pair of batteries, and comparing the absolute value (V2) with the predetermined voltage value.

7. The method of claim 5, wherein the warning operation includes generating, by the warning unit, at least one of the warning sound and the warning light at a predetermined warning time interval.

8. The method of claim 5, further comprising:
a warning determining operation of determining whether the warning unit generates the warning sound or the warning light when the difference in the voltage between the pair of batteries is less than the predetermined voltage value in the voltage balance determining operation;
a voltage balance re-determining operation of comparing the difference in the voltage between the pair of batteries with the predetermined voltage value when the warning unit generates the warning sound or the warning light in the warning determining operation; and
a warning off operation of turning off, by the warning unit, the warning sound and the warning light when the difference in the voltage between the pair of batteries is less than the predetermined voltage value in the voltage balance re-determining operation.

9. The method of claim 5, further comprising:
a standby operation of standing by for a predetermined standby time after driving the engine in the starting operation.

* * * * *